(12) United States Patent
Lee (10) Patent No.: US 8,319,107 B2
(45) Date of Patent: Nov. 27, 2012

(54) CIRCUIT BOARD AND RADIATING HEAT SYSTEM FOR CIRCUIT BOARD

(76) Inventor: Ki-Geon Lee, Seoul (KR)

( * ) Notice: Subject to any disclaimer, the term of this patent is extended or adjusted under 35 U.S.C. 154(b) by 988 days.

(21) Appl. No.: 12/162,740

(22) PCT Filed: Feb. 7, 2007

(86) PCT No.: PCT/KR2007/000655
§ 371 (c)(1),
(2), (4) Date: Jul. 30, 2008

(87) PCT Pub. No.: WO2007/091832
PCT Pub. Date: Aug. 16, 2007

(65) Prior Publication Data
US 2009/0038826 A1 Feb. 12, 2009

(30) Foreign Application Priority Data

Feb. 10, 2006 (KR) .................. 10-2006-0012852
Dec. 27, 2006 (KR) .................. 10-2006-0134626

(51) Int. Cl.
*H05K 7/20* (2006.01)
(52) U.S. Cl. .................... 174/252; 361/719
(58) Field of Classification Search .............. None
See application file for complete search history.

(56) References Cited

U.S. PATENT DOCUMENTS

| 4,254,447 A | * | 3/1981 | Griffis | 361/719 |
| 4,945,451 A | * | 7/1990 | Gohl et al. | 361/720 |
| 6,045,240 A | | 4/2000 | Hochstein | |
| 6,190,941 B1 | | 2/2001 | Heinz et al. | |
| 6,212,076 B1 | * | 4/2001 | MacQuarrie et al. | 361/720 |

(Continued)

FOREIGN PATENT DOCUMENTS
JP 2004-071941 3/2004
(Continued)

*Primary Examiner* — Gregory Thompson
(74) *Attorney, Agent, or Firm* — Park & Associates IP Law, P.C.

(57) ABSTRACT

A circuit board and a heat radiating system of the circuit board. In the circuit board, a plurality of conductive layer regions coated with a conductor are separately formed on both sides of an insulating substrate, the conductive layer region formed on either side of an insulating region on each of the both sides of the insulating substrate, the plurality of the conductive layer regions includes a plurality of through holes which penetrate through the insulating substrate and are coated with a conductor over an inner wall, the conductor in the through hole electrically conducts the coated conductor of the plurality of the conductive layer regions, one of the lead pins is connected to one of the separated conductive layer regions on the both sides based on the insulating region, and the other lead pin is connected to the other conductive layer region. Accordingly, the efficient heat radiation of the circuit board can prevent the component malfunction, the lifespan reduction, the power consumption increase, and the illuminance drop.

4 Claims, 9 Drawing Sheets

U.S. PATENT DOCUMENTS

| | | | |
|---|---|---|---|
| 6,335,862 B1 * | 1/2002 | Koya | 361/708 |
| 6,351,385 B1 * | 2/2002 | Featherstone, III | 361/704 |
| 6,882,537 B2 * | 4/2005 | Barcley | 361/719 |
| 6,920,046 B2 | 7/2005 | Spryshak | |
| 7,362,576 B2 * | 4/2008 | Takeda et al. | 361/704 |
| 7,532,479 B2 * | 5/2009 | Ohno et al. | 361/719 |
| 2003/0029637 A1 | 2/2003 | Barcley | |
| 2003/0048641 A1 | 3/2003 | Alexanderson et al. | |
| 2003/0184969 A1 | 10/2003 | Itabashi et al. | |
| 2004/0180209 A1 | 9/2004 | Cheng et al. | |
| 2005/0195566 A1 * | 9/2005 | Chen et al. | 361/688 |
| 2009/0207630 A1 * | 8/2009 | Satoh et al. | 362/615 |

FOREIGN PATENT DOCUMENTS

| | | |
|---|---|---|
| KR | 2019980060568 | 11/1998 |
| KR | 100527367 | 11/2005 |

* cited by examiner

CIRCUIT BOARD AND RADIATING HEAT SYSTEM FOR CIRCUIT BOARD

TECHNICAL FIELD

The present invention generally relates to a circuit board having a heat radiating structure. More particularly, the present invention relates to a circuit board having a heat radiating structure for effectively radiating heat produced from components

BACKGROUND ART

Typically, a number of components are mounted on a circuit board. When power is supplied, the components operate and produce heat. If the generated heat is not radiated, the components are subject to the malfunction and the damage due to the heat. Particularly, light emitting components such as LED, which produce a great deal of heat than other components, are subject to the severe heat damage compared to other components.

Figure 1:
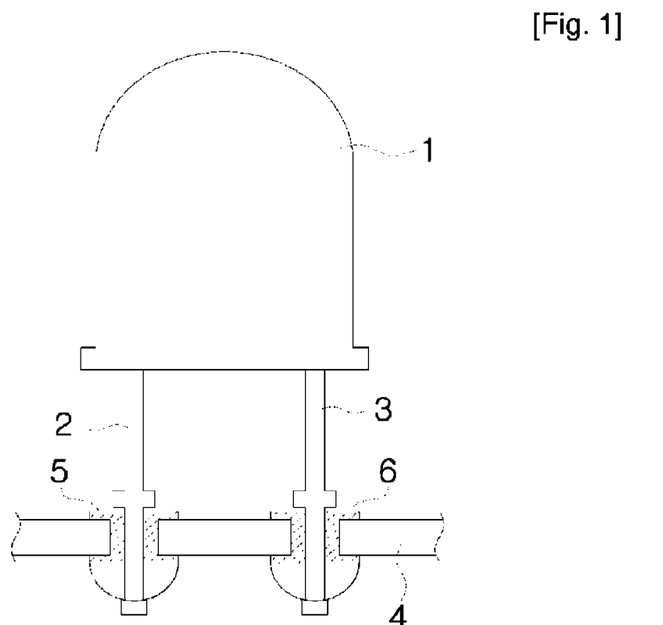
FIG. 1 is a cross section view of a conventional circuit board with an LED mounted.
Figure 2:
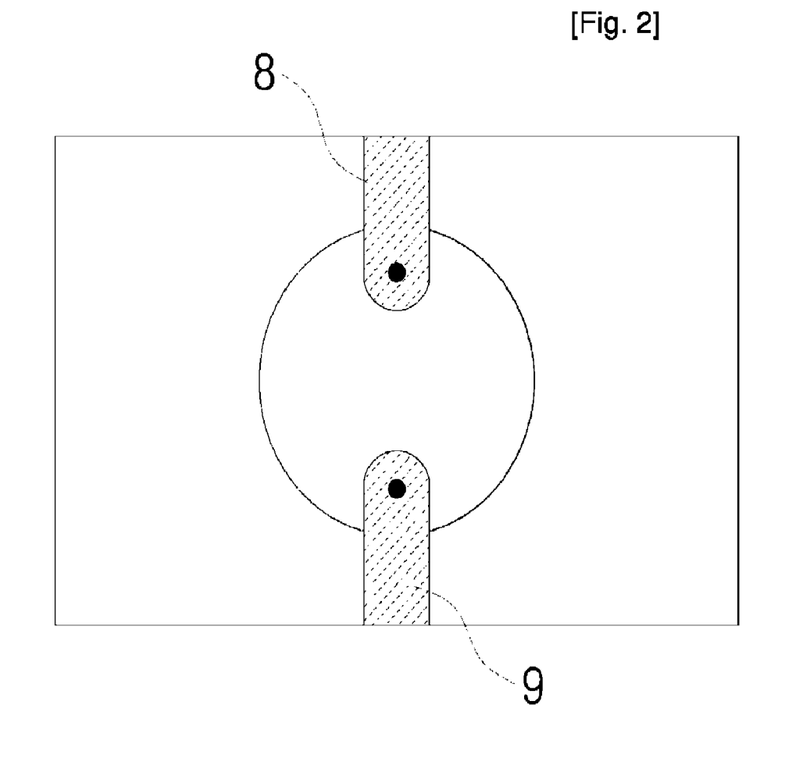
FIG. 2 is a plane view of the circuit board of FIG. 1.

FIG. 1 is a cross section view of a conventional circuit board having an LED, and FIG. 2 is a plane view of the circuit board of FIG. 1.

The circuit board includes an insulating substrate 4, and conductive patterns 8 and 9 which are formed in upper and lower sides (hereafter, referred to as both sides). The circuit board has through holes where the LED is mounted. Eyelets 5 and 6 in sleeve shape are disposed in the through holes.

The LED mounted in the circuit board includes an LED body 1, and a pair of lead pins 2 and 3 protruding below the LED body 1. The lead pins 2 and 3 are mounted through the through holes of the circuit board and electrically connected to the conductive patterns by means of soldering. Power is supplied to the LED mounted in the circuit board through the conductive patterns 8 and 9, to thus turn on the LED and emit the light.

As radiating, the LED produces a great deal of heat. Thus, if the heat is not exhausted to outside, the heat may attenuate the brightness of the LED and shorten the life span of the LED.

To prevent the malfunction and the lifespan reduction of the components mounted in the circuit board, the heat produced by the components should be dissipated. In particular, a radiating structure is essential to the heat producing component such as LED.

To respond to this, the conventional methods mostly radiate the heat to outside by mounting a separate heat sink on the circuit board. However, the radiation effect does not meet the expectations because the heat is not effectively radiated merely by mounting the heat sink.

DISCLOSURE OF INVENTION

Technical Problem

An aspect of the present invention has been provided to solve the above-mentioned and/or other problems and disadvantages and an aspect of the present invention provides a circuit board and a heat radiating system of the circuit board, which can effectively radiate heat produced from components.

Technical Solution

According to an aspect of the present invented, a circuit board is mounted with an electronic component having two power supply lead pins, wherein a plurality of conductive layer regions coated with a conductor arc separately formed on both sides of an insulating substrate, the conductive layer regions formed on either side of an insulating region on each of the both sides of the insulating substrate of the circuit board, the plurality of the conductive layer regions include a plurality of through holes which penetrate through the insulating substrate and are coated with a conductor over an inner wall, the conductor in the through holes eclectically conducts the coated conductor of the plurality of the conductive layer regions, one of the lead pins is connected to one of the separated conductive layer regions on the both sides based on the insulating region, and the other lead pin is connected to the other conductive layer region.

A material of the conductor coated in the through holes may be the same material coated in the plurality of the conductive layer regions.

A radiating pin may be inserted each through hole to which the lead pin is not inserted.

The electronic component may be a light-emitting diode (LED).

According to another aspect of the present invention, a circuit board includes an upper insulating region which is formed on an upper side of an insulating region to insulate electricity; a first conductive layer region and a second conductive layer region which are separately formed on both sides of the upper insulating region and coated with a conductor; a lower insulating region which is formed on a lower side of the insulating substrate to insulate electricity; a third conductive layer region and a fourth conductive layer region which are formed separately on both sides of the lower insulating region and coated with a conductor, the third conductive layer region facing the first conductive layer region and the fourth conductive layer region facing the second conductive layer region; and a plurality of the through holes which penetrate the insulating substrate and are coated with a conductor in inner wall to electrically conduct the first conductive layer region with third conductive layer region and the second conductive layer region with the forth conductive layer region According to yet another aspect of the present invention, a heat radiating system of a circuit board includes the circuit board which comprises a plurality of conductive layer regions formed by coating both sides of an insulating substrate with a conductor, and a plurality of the through holes formed by penetrating the insulating substrate in the conductive layer regions and coated with a conductor on an inner wall; a radiating pad which adheres to one side of the circuit board and receives heat from the circuit board, the radiating pad formed of an insulator; and a heat sink which is coupled to the radiating pad and receives and exhausts the heat of the circuit board from the radiating pad to outside, the heat sink formed of a metal.

The radiating pad may be formed of a silicon.

The heat sink may include a heat sink body which is formed in a plate shape and adheres to the radiating pad, and a fixing arm which is formed in a hook shape along a circumference of the heat sink body to secure the radiating pad with the circuit board.

A radiating groove may be depressed lengthwise in one direction of the heat sink body in one side of the heat sink body, the one side facing the radiating pad, and a plurality of the radiating grooves may be formed at intervals in the other direction of the heat sink body.

A radiating rib may protrude lengthwise in one direction of the heat sink body in the other side of the heat sink body, and a plurality of the radiating ribs may be formed at intervals in the other direction of the heat sink body.

The fixing arm may bend toward the radiating pad from the circumference of the heat sink body and bend toward a center of the heat sink body.

Advantageous Effects

Since the heat radiation of the circuit board is effectively carried out, component malfunction, lifespan reduction, power consumption increase, and illuminance drop can be prevented.

Although a few embodiments of the present invention have been shown and described, it would be appreciated by those skilled in the art that changes may be made in these embodiments without departing from the principles and spirit of the invention, the scope of which is defined in the claims and their equivalents.

BEST MODE FOR CARRYING OUT THE INVENTION

The embodiments are described below in order to explain the present invention by referring to the figures.

Figure 3:
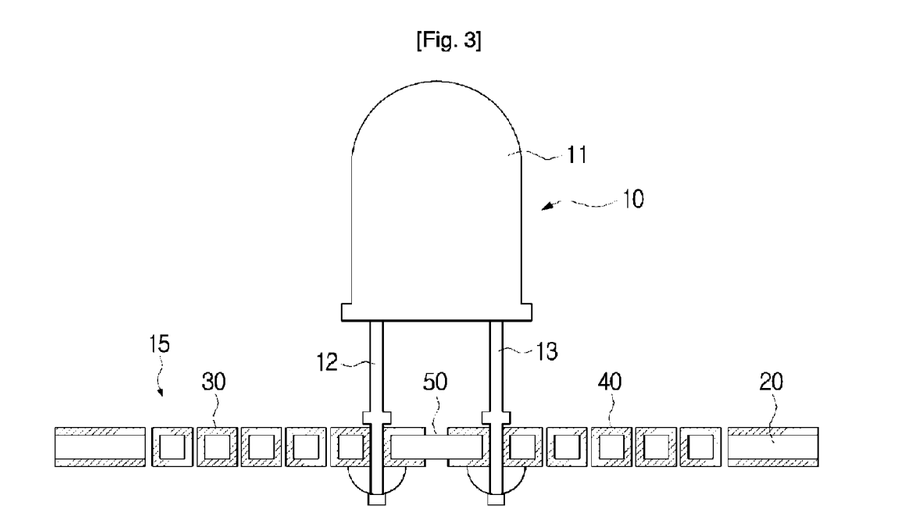
FIG. 3 is a cross section view of a circuit board with an LED mounted according to a first embodiment of the present invention.
Figure 4:
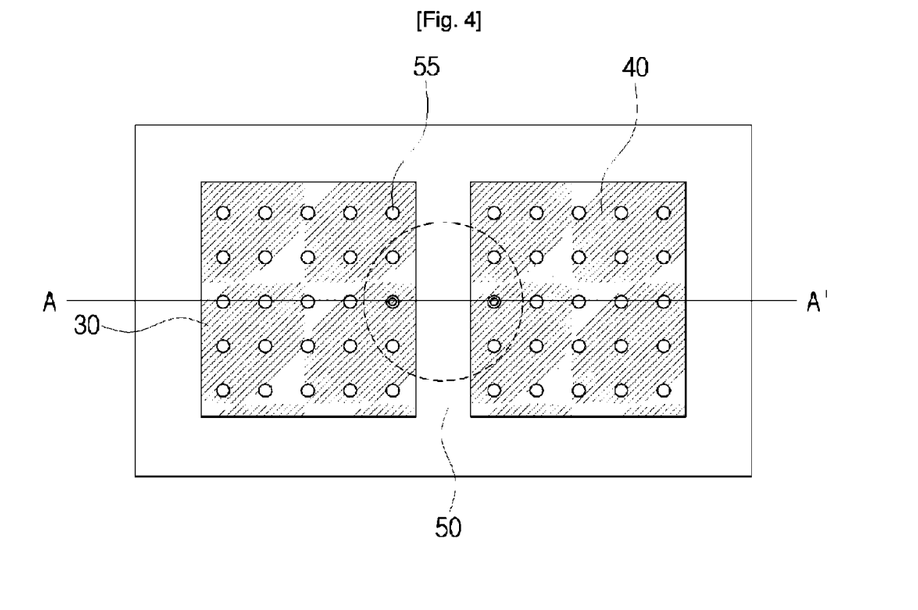
FIG. 4 is a plane view of the circuit board of FIG. 3.

FIG. 3 is a cross section view of a circuit board with an LED mounted according to a first embodiment of the present invention, and FIG. 4 is a plane view of the circuit board of FIG. 3. FIG. 3 is a cross section view of the circuit board with the mounted LED, taken along the line AA' in FIG. 4.

In the first embodiment of the present invention, a high-brightness LED 10 is illustrated as a component mounted on the circuit board 15. The high-brightness LED 10 includes an LED body 11, and a pair of lead pins 12 and 13 drawing out from the LED body 11.

The circuit board 15 includes an insulating substrate 20, and a pair of conductive layer regions 30 and 40 that are formed by symmetrically coating with a conductor in both sides (or upper and lower sides) of the insulating substrate 20. The conductive layer regions 30 and 40 are separated from each other across an insulating region 50 not coated with a conductor. Herein, a plurality of the through holes 55 are formed in each of the conductive layer regions 30 and 40. An inner wall of the through holes 55 is coated with the same material as the conductor forming the conductive layer. By virtue of the conductor coated on the inner wall of the the through holes 55, the conductive layer regions 30 and 40 formed on the both sides of the insulating substrate 20 are electrically connected to each other.

The conductor is coated on the inner wall of the through holes 55 while the conductive layer is coated. The through holes 55 serves to not only eclectically connect the conductive layer regions in the both sides of the insulating substrate 20 but also transfer the heat produced from the component.

To mount the light-brightness LED 10 on the circuit board, the pair of the lead pines pins and 13 of the high-brightness LED 10 is first inserted to the through holes 55 formed in the different conductive layer regions 30 and 40. The inserted lead pins 12 and 13 are soldered and fixed. Next, when power is supplied to the conductive layer regions 30 and 40, the high-brightness LED 10 is powered on to emit the light.

As radiating, the high-brightness LED 10 produces heat. The produced heat is transferred and radiated along the conductive layer regions 30 and 40 and along the conductor in the through holes 55 at the same time. At this time, since the surface area of the conductive layer region increases thanks to the conductor in the through holes 55, the area of the heat radiation also increases. As a result, the increased surface area of the heat radiation raises the radiation effect.

Figure 5:
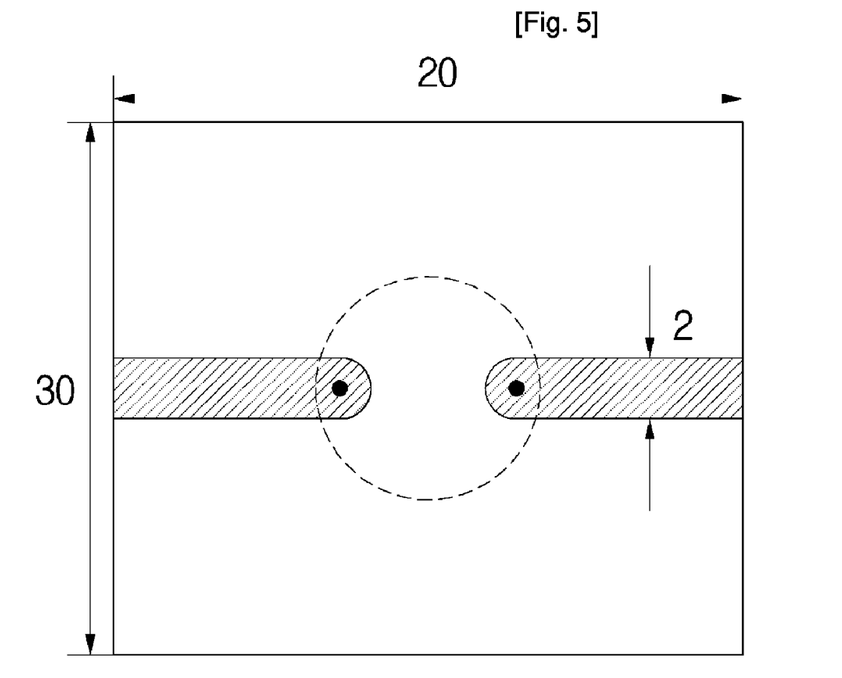
FIG. 5 is a plane view of a comparison circuit board.
Figure 6:
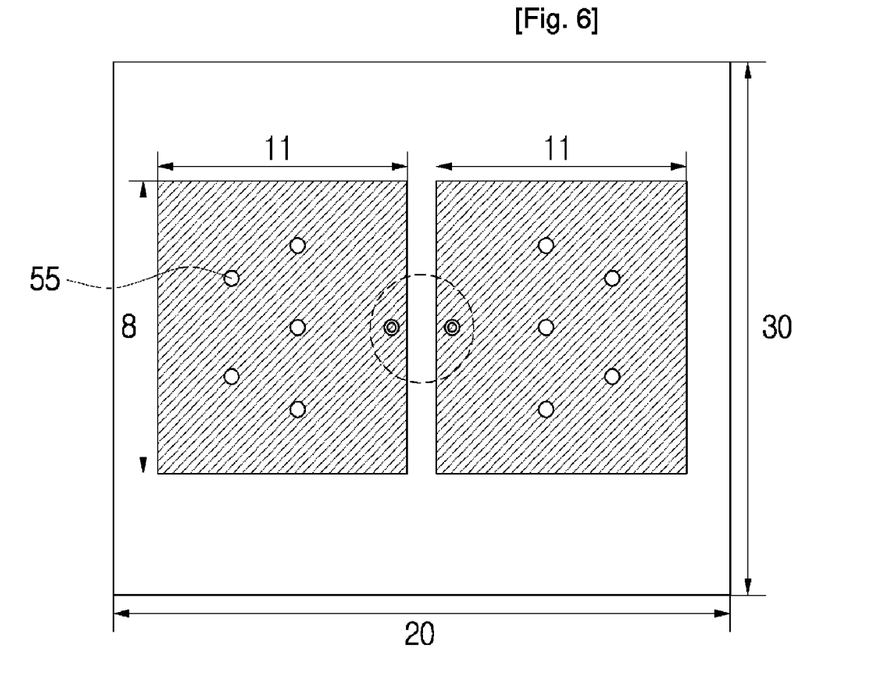
FIG. 6 is a plane view of an experimental circuit board according to the present invention.

FIG. 5 is a plane view of a comparison circuit board, and FIG. 6 is a plane view of an experimental circuit board according to the present invention.

The comparison circuit board in FIG. 5 is used to prove the radiation effect of the circuit board of the present invention by comparison, and the experimental circuit board is the circuit board according to the present invention. The comparison circuit board and the experimental circuit board both are 20 cm in width, 30 cm in length, and 1.8 mm in thickness. The width of the conductive pattern of the comparison circuit board is 2 mm. The experimental circuit board has two conductive layer regions, of which size is 8 mm and 11 mm respectively. Six through holes 55 are formed in each conductive layer region. Diameter of the through holes 55 is 1 mm.

The high-brightness LED used for the test is Toyoda Gosei's product (Japan), of which the rated voltage is DC 3.4V, the rated current is 70 mA, and the lower diameter of the LED body is 3 mm. The lead pins of the high-brightness LED pass through two through holes formed in the portion indicated by the dotted circuit in FIG. 6 and then are fixed by the soldering.

Figure 7:
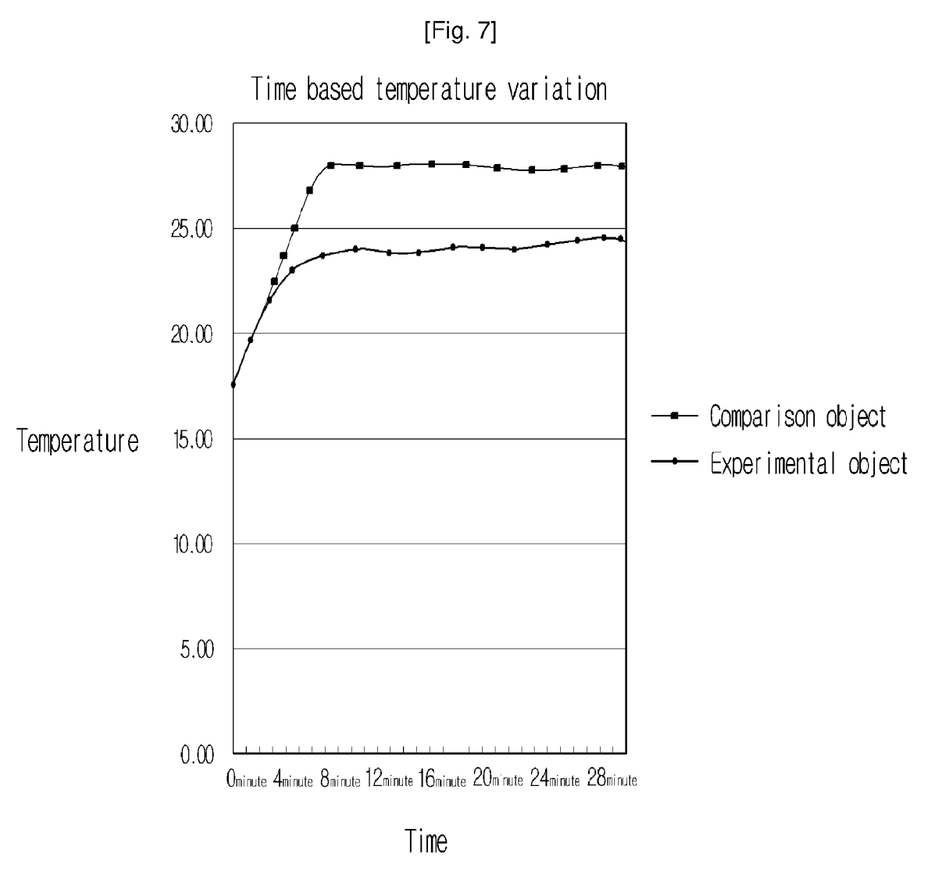
FIG. 7 is a graph showing time based temperature variation of the comparison object and the experimental object.

FIG. 7 is a graph showing time based temperature variation of the comparison object and the experimental object, which is tabulated as Table 1.

As shown in FIG. 7 and Table 1, after the high-brightness LED is turned on, the temperature of the circuit board increase as the time passes by. After 10 minutes, the temperature of the comparison object ranges 27.60~27.80° C., whereas the temperature of the present circuit board ranges 24.20~24.60° C. Hence, the circuit board of the present invention, which has the lower temperature than the related art by about 3.20~3.40° C., can enhance the radiation effect.

TABLE 1

| Time elapse (min) | Temperature (° C.) | |
| --- | --- | --- |
| | Comparison | Experiment |
| 0 | 17.40 | 17.40 |
| 1 | 20.60 | 20.40 |
| 2 | 23.40 | 21.80 |
| 3 | 25.20 | 22.80 |
| 4 | 26.20 | 23.40 |
| 5 | 26.80 | 23.60 |
| 6 | 27.20 | 23.80 |
| 7 | 27.40 | 23.80 |
| 8 | 27.40 | 23.90 |
| 9 | 27.60 | 24.00 |
| 10 | 27.60 | 24.20 |
| 11 | 27.60 | 24.20 |
| 12 | 27.40 | 24.20 |
| 13 | 27.60 | 24.20 |
| 14 | 27.60 | 24.20 |
| 15 | 27.60 | 24.20 |
| 16 | 27.80 | 24.40 |
| 17 | 27.80 | 24.20 |
| 18 | 27.80 | 24.20 |
| 19 | 27.80 | 24.40 |
| 20 | 27.80 | 24.20 |
| 21 | 27.60 | 24.20 |
| 22 | 27.60 | 24.40 |
| 23 | 27.80 | 24.40 |
| 24 | 27.60 | 24.20 |
| 25 | 27.60 | 24.40 |
| 26 | 27.60 | 24.40 |
| 27 | 27.60 | 24.40 |
| 28 | 27.80 | 24.60 |
| 29 | 27.80 | 24.60 |
| 30 | 27.60 | 24.40 |

Figure 8:
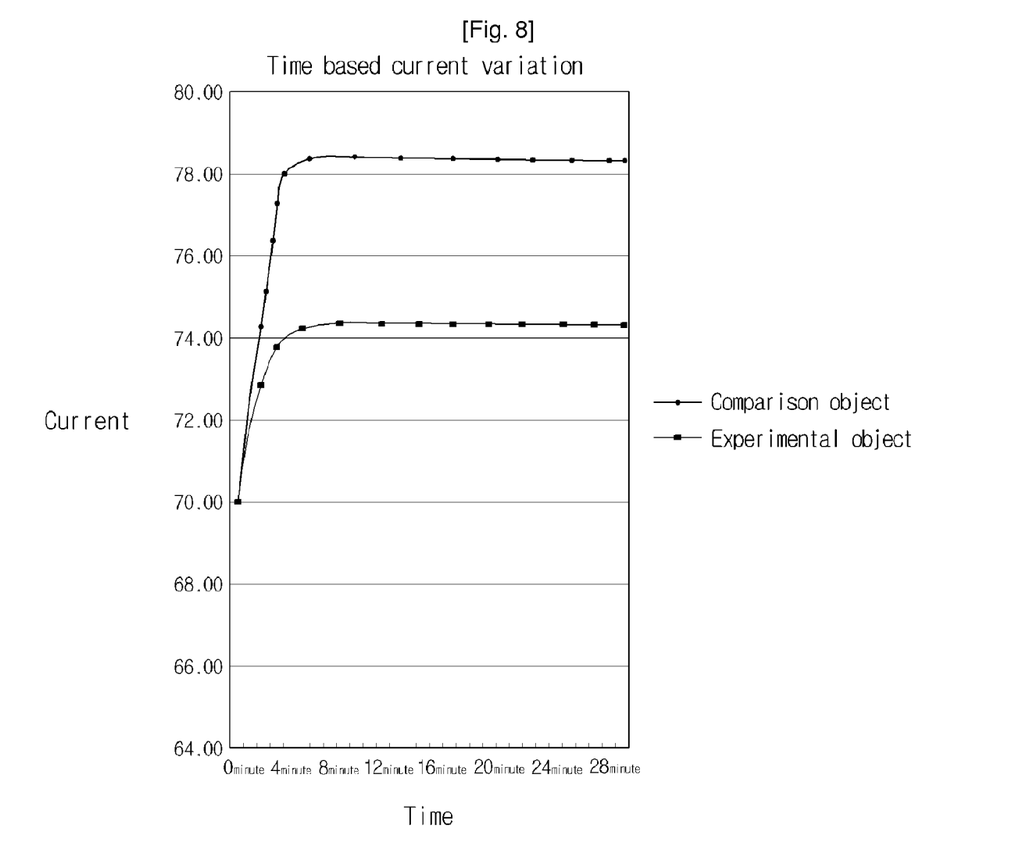
FIG. 8 is a graph showing current variation of the comparison object and the experimental object.

FIG. 8 is a graph showing current variation of the comparison object and the experimental object, which is tabulated as Table 2.

As shown in FIG. 8 and Table 2, after the high-brightness LED is turned on, the current consumption increases. After a certain time elapses, the current of the comparison object ranges 78.60~78.70 mA, whereas the current of the experimental object maintains 74.60 mA. That is, when using the circuit board of the present invention, the current consumed by the components decreases. As a result, the power consumption lowers and the energy efficiency increases.

TABLE 2

| Time elapse(min) | Current (mA) | |
| --- | --- | --- |
| | Comparison | Experiment |
| 0 | 70.00 | 70.00 |
| 1 | 73.50 | 72.90 |
| 2 | 75.80 | 73.90 |
| 3 | 76.90 | 74.30 |
| 4 | 77.60 | 74.50 |
| 5 | 77.90 | 74.60 |
| 6 | 78.20 | 74.70 |
| 7 | 78.30 | 74.70 |
| 8 | 78.50 | 74.70 |
| 9 | 78.50 | 74.70 |
| 10 | 78.60 | 74.70 |
| 11 | 78.60 | 74.70 |
| 12 | 78.60 | 74.70 |
| 13 | 78.60 | 74.70 |
| 14 | 78.70 | 74.70 |
| 15 | 78.70 | 74.60 |
| 16 | 78.70 | 74.60 |
| 17 | 78.70 | 74.60 |
| 18 | 78.70 | 74.60 |
| 19 | 78.70 | 74.60 |
| 20 | 78.70 | 74.60 |
| 21 | 78.70 | 74.60 |

TABLE 2-continued

| Time elapse(min) | Current (mA) | |
| --- | --- | --- |
| | Comparison | Experiment |
| 22 | 78.70 | 74.60 |
| 23 | 78.70 | 74.70 |
| 24 | 78.70 | 74.60 |
| 25 | 78.60 | 74.60 |
| 26 | 78.70 | 74.60 |
| 27 | 78.60 | 74.60 |
| 28 | 78.60 | 74.60 |
| 29 | 78.60 | 74.60 |
| 30 | 78.70 | 74.60 |

Figure 9:
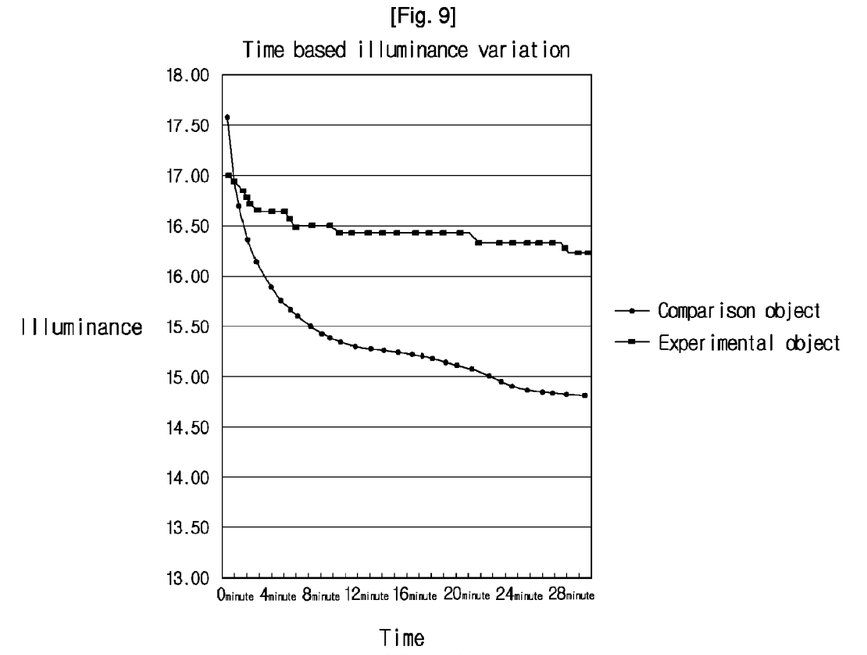
FIG. 9 is a graph showing illuminance variation of high-brightness LEDs mounted to the comparison object and the experimental object.

FIG. 9 is a graph showing illuminance variation of high-brightness LEDs mounted to the comparison object and the experimental object, which is tabulated as Table 3.

As shown in FIG. 9 and Table 3, as time elapses, the illuminance of the comparison circuit board abruptly decreases by 2.2 lux for 30 minutes, which implies the illuminance decreases by 13% during the initial 30 minutes. By contrast, the illuminance of the experimental circuit board decreases merely by 0.8 lux for 30 minutes, which corresponds to ⅓ of the illuminance decrease of the comparison circuit board. In other words, when using the circuit board of the present invention, the lifespan and the performance of the components can be enhanced.

TABLE 3

| Time elapse(min) | Illuminance (Lux) | |
| --- | --- | --- |
| | Comparison | Experiment |
| 0 | 17.00 | 17.00 |
| 1 | 16.90 | 16.90 |
| 2 | 16.50 | 16.70 |
| 3 | 16.20 | 16.60 |
| 4 | 16.00 | 16.60 |
| 5 | 15.80 | 16.50 |
| 6 | 15.70 | 16.50 |
| 7 | 15.60 | 16.50 |
| 8 | 15.50 | 16.50 |
| 9 | 15.40 | 16.40 |
| 10 | 15.38 | 16.40 |
| 11 | 15.35 | 16.40 |
| 12 | 15.30 | 16.40 |
| 13 | 15.30 | 16.40 |
| 14 | 15.25 | 16.40 |
| 15 | 15.20 | 16.40 |
| 16 | 15.20 | 16.40 |
| 17 | 15.15 | 16.40 |
| 18 | 15.10 | 16.40 |
| 19 | 15.05 | 16.40 |
| 20 | 15.00 | 16.40 |
| 21 | 15.00 | 16.30 |
| 22 | 14.95 | 16.30 |
| 23 | 14.90 | 16.30 |
| 24 | 14.90 | 16.30 |
| 25 | 14.90 | 16.30 |
| 26 | 14.88 | 16.30 |
| 27 | 14.85 | 16.30 |
| 28 | 14.80 | 16.30 |
| 29 | 14.80 | 16.20 |
| 30 | 14.80 | 16.20 |

MODE FOR THE INVENTION

Figure 10:
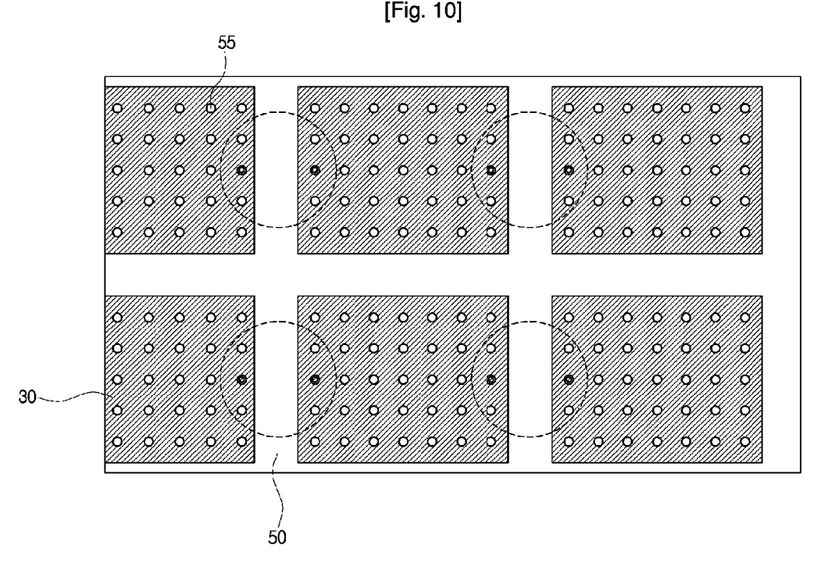
FIG. 10 is a plane view of a circuit board according to a second embodiment of the present invention.

FIG. 10 is a plane view of a circuit board according to a second embodiment of the present invention.

In the circuit board, a plurality of conductive layer regions 30 is formed across an insulating region 50 in both upper and lower sides. As in the first embodiment of the present invention, a plurality of through holes 55 are formed in each conductive layer region 30. The inner wall of the through holes 55 is coated with the same conductor as the conductor coated over the conductive layer region 30.

Components are mounted on the circuit board to interconnect the neighboring conductive layer regions 30. When the power is supplied, the components start to operate.

Figure 11:
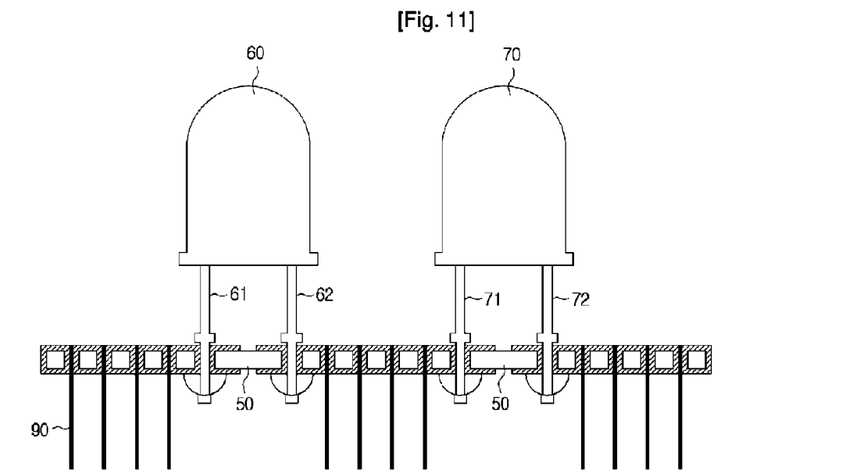
FIG. 11 is a cross section view of a circuit board according to a third embodiment of the present invention.
Figure 12:
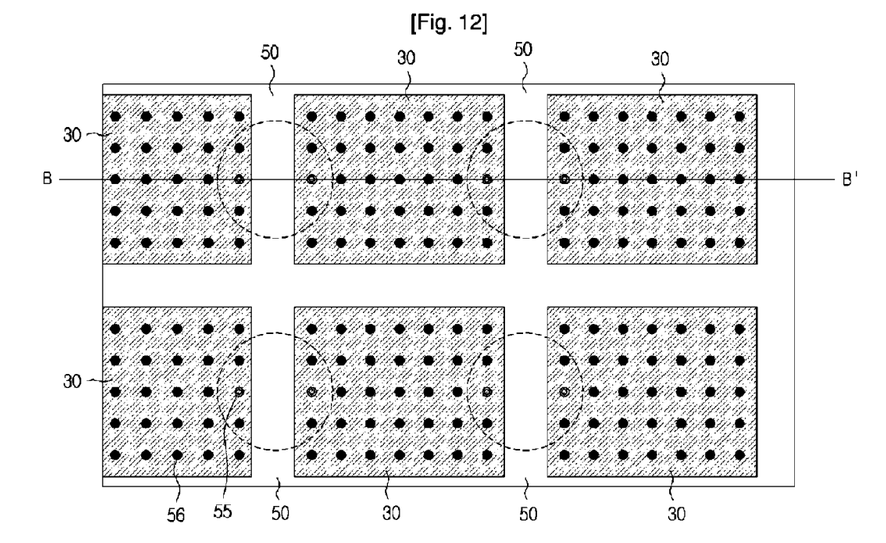
FIG. 12 is a plane view of FIG. 11.

FIG. 11 is a cross section view of a circuit board according to a third embodiment of the present invention, and FIG. 12 is a plane view of FIG. 11. FIG. 11 is a cross section view of the circuit board with the LED mounted, taken along the line BB' of FIG. 12.

In the circuit board, a plurality of conductive layer regions 30 is formed in both sides across an insulating region 50, as in the second embodiment of the present invention. A plurality of through holes 55 and 56 are formed in each conductive layer region 30. The inner wall of the through holes 55 and 56 is coated with the same conductor as the conductor coated over the conductive layer region 30.

Additionally, the circuit board has radiating pins 90 protruding downward by inserting and fixing to the through holes 56 where lead pins 61, 62, 71 and 72 of the high-brightness LEDs 60 and 70 are not inserted. Since the radiating pins 90 are electrically and thermally coupled with the inner wall of the through holes 56 and the conductive layers on both sides, the heat radiation is effectively performed.

Figure 13:
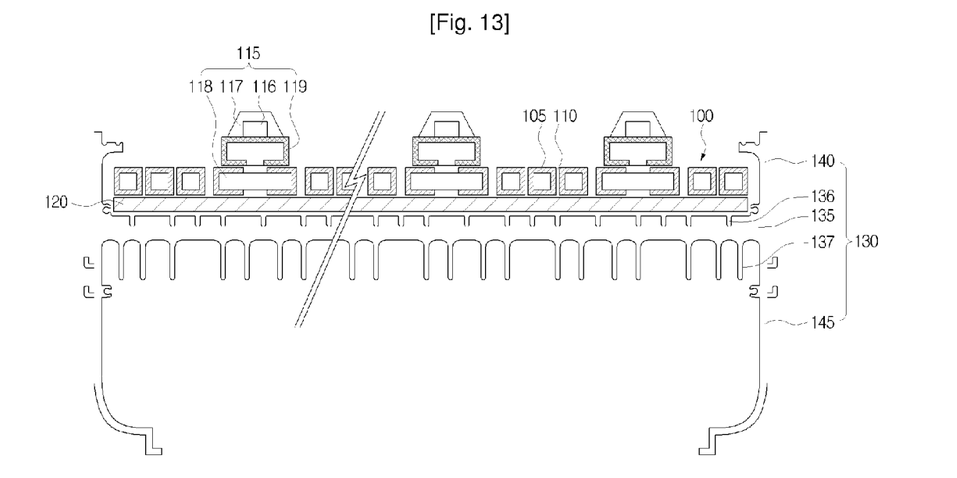
FIG. 13 is a cross section view of a circuit board heat radiating system according to a fourth embodiment of the present invention.

FIG. 13 is a cross section view of a circuit board heat radiating system according to a fourth embodiment of the present invention.

The circuit board heat radiating system includes a circuit board 100 having a plurality of the through holes 110, a radiating pad 120 attached to one side of the circuit board 100, and a heat sink 130 mounted to the outside of the radiating pad 120.

As in the first and second embodiments of the present invention, the circuit board 100 includes a plurality of conductive layer regions 105 formed symmetrically in both sides of the insulating substrate. A plurality of the through holes 110 is formed in the conductive area 105. The inner wall of the through holes 110 is coated with the same conductor as in the conductive layer region 105.

Components are mounted on the circuit board 100. In this embodiment, a chip LED 115 is mounted thereon. The chip LED 115 includes an LED body 116, a LED cover 117, a pair of electrodes 119, and an LED substrate 118. Herein, the pair of the electrodes 119 is formed to surround the LED substrate 118. The electrodes 119 are soldered to the surface of the circuit board 100 so that the chip LED 115 is mounted directly on the surface of the circuit board 100.

The radiating pad 120 is formed as a plate shape and adhered to one side of the circuit board 110 where the components are not mounted. The radiating pad 120 is fabricated using an insulator such as silicon. Accordingly, the radiating pad 120 can avoid the short between the conductive layer regions 105. The radiating pad 120 receives the heat, which is produced by the components, from the circuit board 100. As the through holes 110 are formed in the circuit board 100, the heat can be more efficiently and rapidly transferred to the radiating pad 120 via the through holes 110. As such, the radiating pad 120 lowers the temperature of the circuit board 100 by exhausting the heat from the circuit board 100 to the other side.

The heat sink 130, like the radiating pad 120, is formed in a plate shape and mounted to the exterior of the radiating pad 120. The heat sink 130 can be fabricated using a metal of the fast heat transfer and radiation, for example, using aluminum.

Figure 14:
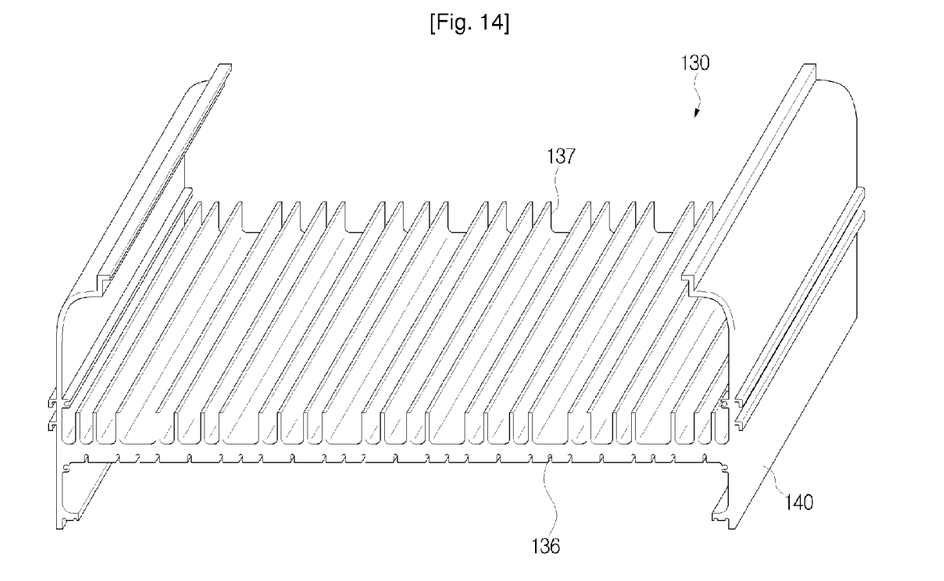
FIG. 14 is a perspective view of the heat sink of FIG. 13.

FIG. 14 is a perspective view of the heat sink of FIG. 13.

The heat sink 130 includes a heat sink body 135 in close contact with the radiating pad 120, a fixing arm 140 which secures the radiating pad 120 and the circuit board 100 along the circumference of the heat sink body 135, and a coupling arm 145 which couples the heat sink 130 to the device body.

In the side facing the radiating pad 120, the heat sink body 135 has a radiating groove 136 depressed lengthwise along one side of the heat sink body 135. A plurality of the radiating grooves 136 is formed at intervals widthwise in the longitudinal direction. The radiating grooves 136 serve to increase the surface area for receiving the heat transferred from the radiating pad 120, to thus enable the fast and efficient heat transfer of the heat sink 130.

In the side facing the coupling arm 145 of the heat sink body 135, a radiating rib 137 is formed which protrudes lengthwise in one direction of the heat sink body 135. A plurality of the radiating ribs 137 is formed at intervals widthwise in its longitudinal direction. The radiating ribs 137 are formed lengthwise in the same direction of the longitudinal direction of the radiating grooves 136. The interval between the neighboring radiating ribs 137 may be constant or random. Since the radiating ribs 137 serve to increase the surface area for exhausting the heat transferred from the radiating pad 120 to outside, it enables the rapid heat exhaustion of the heat sink 130.

The fixing arm 140 bends from the circumference of the heat sink body 135 toward the side where the radiating groove 136 is formed and bends toward the center of the heat sink body 135. Preferably, the height of the fixing arm 140 from the heat sink body 135 is the sum of the widths of the radiating pad 120 and the circuit board 100.

The coupling arm 145 extends from the circumference of the heat sink body 135 to the opposite direction of the fixing arm 140 and bends its free end toward the center of the heat sink body 135. The coupling arm 145 functions to secure the circuit board 100, the radiating pad 120, and the heat sink 130 within the device body where the circuit board 100 is mounted.

By coupling the radiating pad 120 and the heat sink 130 to the circuit board 100, the heat produced from the components of the circuit board 100 can be radiated efficiently.

Figure 15:
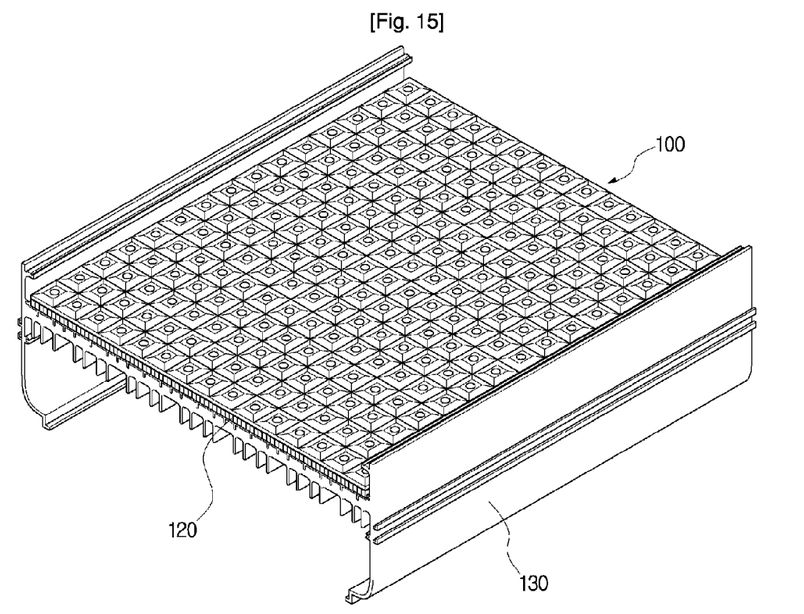
FIG. 15 is a perspective view of a circuit board with a radiating pad and a heat sink mounted.
Figure 16:
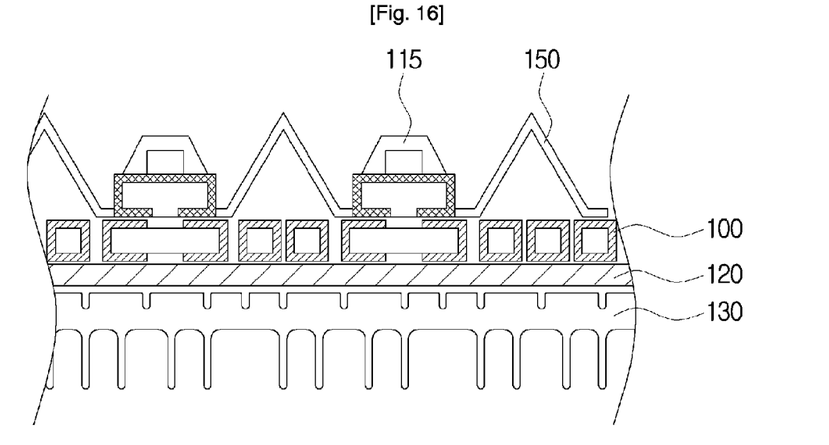
FIG. 16 is a side cross section view of FIG. 15.

FIG. 15 is a perspective view of a circuit board with a radiating pad and a heat sink mounted, and FIG. 16 is a side cross section view of FIG. 15.

On the circuit board 100, a plurality of chip LEDs 115 is arranged in a matrix form at intervals. Between the circuit board 100 and the chip LED 115, a reflecting plate 150 is mounted to improve the illuminance by reflecting the light radiated from the chip LED 115. The reflecting plate 150 is formed in a quadrangular pyramid shape. Receding from the circuit board 100, the width increases.

With the plurality of the chip LEDs 115, the temperature of the circuit board 100 rises due to the heat produced at the chip LEDs 115. The heat transferred to the circuit board 100 is transferred to the radiating pad 120. Next, the heat is transferred to the heat sink 130. Since the radiating groves 130 of the heat sink 130 increase the surface area, the fast heat transfer is achieved. The heat transferred to the heat sink 130 is exhausted to outside rapidly by means of the radiating ribs 137 of the heat sink 130.

As above, the heat radiating system of the circuit board rapidly exhausts the heat transferred from the components to the circuit board 100, to thus accomplish the efficient heat radiation of the circuit board 100. Therefore, it is possible not only to prevent the components mounted on the circuit board 100 from malfunctioning or reducing the lifespan because of the heat but also to lower the power consumption. Particularly, in case of a light emitting component such as chip LED 115, the illuminance drop of the chip LED 115 can be prevented.

INDUSTRIAL APPLICABILITY

The present invention is applicable to the electronics industry to effectively radiate the heat produced from the electronic components mounted on the circuit board.

The invention claimed is:

1. A circuit board for mounting an electronic component having first and second lead pins, said circuit board comprising:
    an insulating substrate; and
    a plurality of conductive layer regions that are formed by symmetrically coating with a conductor on both sides of the insulating substrate, wherein the conductive layer regions are separated from each other across an insulating region, wherein a plurality of through holes are formed in each of said conductive layer region and through the insulating substrate, each of said through holes coated with a conductor, wherein the first lead pin of the electronic component is mounted to one of said through holes which is formed in one of said conductive layer regions, and the second lead pin of the electronic component is mounted to another one of said through holes which is formed in another one of said conductive layer regions.

2. The circuit board of claim 1, wherein a material of the conductor coated in the through holes is the same material coated in the plurality of the conductive layer regions.

3. The circuit board of claim 2, wherein radiating pins are inserted to the through holes to which the first and second lead pins are not inserted.

4. The circuit board of claim 3, wherein the electronic component is a light-emitting diode (LED).

* * * * *